(12) United States Patent
Narayan

(10) Patent No.: US 6,856,178 B1
(45) Date of Patent: Feb. 15, 2005

(54) MULTI-FUNCTION INPUT/OUTPUT DRIVER

(75) Inventor: Sriram Narayan, Pleasanton, CA (US)

(73) Assignee: Silicon Bridge, Inc., Fremont, CA (US)

( * ) Notice: Subject to any disclaimer, the term of this patent is extended or adjusted under 35 U.S.C. 154(b) by 0 days.

(21) Appl. No.: 10/631,285

(22) Filed: Jul. 31, 2003

(51) Int. Cl.[7] .................................................. H03B 1/00
(52) U.S. Cl. .......................... 327/108; 327/112; 326/87
(58) Field of Search ................................. 327/108, 112, 327/82, 83, 85, 86, 87, 90; 326/30, 82, 87; 365/201, 156; 363/60

(56) References Cited

U.S. PATENT DOCUMENTS 5,959,854 A * 9/1999 Okada .......................... 363/60
6,327,176 B1 * 12/2001 Li et al. ....................... 365/156
6,600,684 B2 * 7/2003 Satani et al. ................. 365/201
6,724,231 B2 * 4/2004 Yoshikawa ................... 327/291

* cited by examiner

Primary Examiner—Tuan T. Lam
Assistant Examiner—Hiep Nguyen
(74) Attorney, Agent, or Firm—William L. Paradice, III

(57) ABSTRACT

A high-speed I/O driver includes circuitry that is configurable to meet single-ended and differential I/O signal standards. For one embodiment, the driver includes four input circuits that can be configured to implement two CMOS inverters to process single-ended signals or configured to implement a differential circuit to process differential signals.

30 Claims, 9 Drawing Sheets

US 6,856,178 B1

MULTI-FUNCTION INPUT/OUTPUT DRIVER

FIELD OF INVENTION

The present invention relates generally to integrated circuits and specifically to input/output (I/O) drivers for integrated circuits.

DESCRIPTION OF RELATED ART

Changing system requirements are driving the need for high bandwidth input/output (I/O) interface standards support. Thus, higher performance systems, driven by faster processors and memories, are increasing the need for higher bandwidth data transfers. In response to these system changes, new I/O standards are continually emerging. For example, many modern processing systems use the High Speed Transceiver Logic (HSTL) standard for data transfers to and from memory, and use the Low Voltage Differential Signaling (LVDS) standard for backplane communications.

The HSTL standard, which includes several classes, specifies the output characteristics for single-ended outputs having both series terminating loads (Class II) and parallel terminating loads (Classes I, III, and IV). The HSTL standard does not specify device supply voltages, thereby making it a process-independent standard. For example, the HSTL Class I standard specifies an input reference voltage $V_{REF}=V_{DD}/2$ and an output terminated to $V_{TT}=V_{DD}/2$, where $V_{DD}$ is the supply voltage. FIG. 1 illustrates a typical HSTL Class I output driver 100. Driver 100 includes a CMOS inverter formed by a PMOS transistor 102 and an NMOS transistor 104 connected in series between $V_{DD}$ and ground potential. An input signal IN is provided to the gates of transistors 102 and 104, and a complementary output signal OUT is generated in response thereto. The output is terminated to $V_{TT}$ via a 50 ohm load resistor $R_D$.

The LVDS standard is a differential signaling standard that specifies a common mode voltage of 1.2 volts and a logic swing of approximately 345 milli-volts between the logic high and logic low levels. Typically, a 100 ohm termination resistor is coupled between the differential signal lines. For example, FIG. 2 illustrates a typical LVDS driver 200. Driver 200 includes a differentially coupled pair of NMOS transistors 202 and 204 biased with a current source 210. The gates of transistors 202 and 204 receive a differential signal defined by input signals IN1 and IN2. PMOS load transistors 206 and 208, which are coupled between the differential pair 202/204 and $V_{DD}$, each receive a bias control voltage Vbias. The differential voltage between IN1 and IN2 causes transistors 202 and 204 to steer current either through load transistor 206 or load transistor 208 to generate a differential signal between OUT1 and OUT2.

Typically, I/O drivers provide functionality for a specific type of signaling, i.e., either single-ended or differential, and therefore offer little flexibility in handling signals specified by varying standards. As a result, applications that utilize signals specified by different I/O standards typically require different types of I/O drivers, which in turn increases circuit complexity and silicon area. Thus, there is a need for an I/O driver having common circuitry that can be configured to process signals specified by different I/O standards such as, for example, the HSTL and LVDS signal standards.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

In accordance with the present invention, a high-speed I/O driver is disclosed that can process signals specified by both single-ended and differential I/O standards. The high-speed driver includes circuitry that is configurable to meet single-ended and differential I/O signal standards without the need for different drivers on each I/O pad to implement the various standards, thereby increasing flexibility while minimizing circuit complexity and silicon area.

In the following description, exemplary embodiments are described in order to provide a thorough understanding of the present invention. For purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be a single signal line, and each of the single signal lines may alternatively be a bus. Further, the logic states of various signals described herein are exemplary and therefore may be reversed or otherwise modified as generally known in the art. Accordingly, the present invention is not to be construed as limited to specific examples described herein but rather includes within its scope all embodiments defined by the appended claims.

Figure 3:
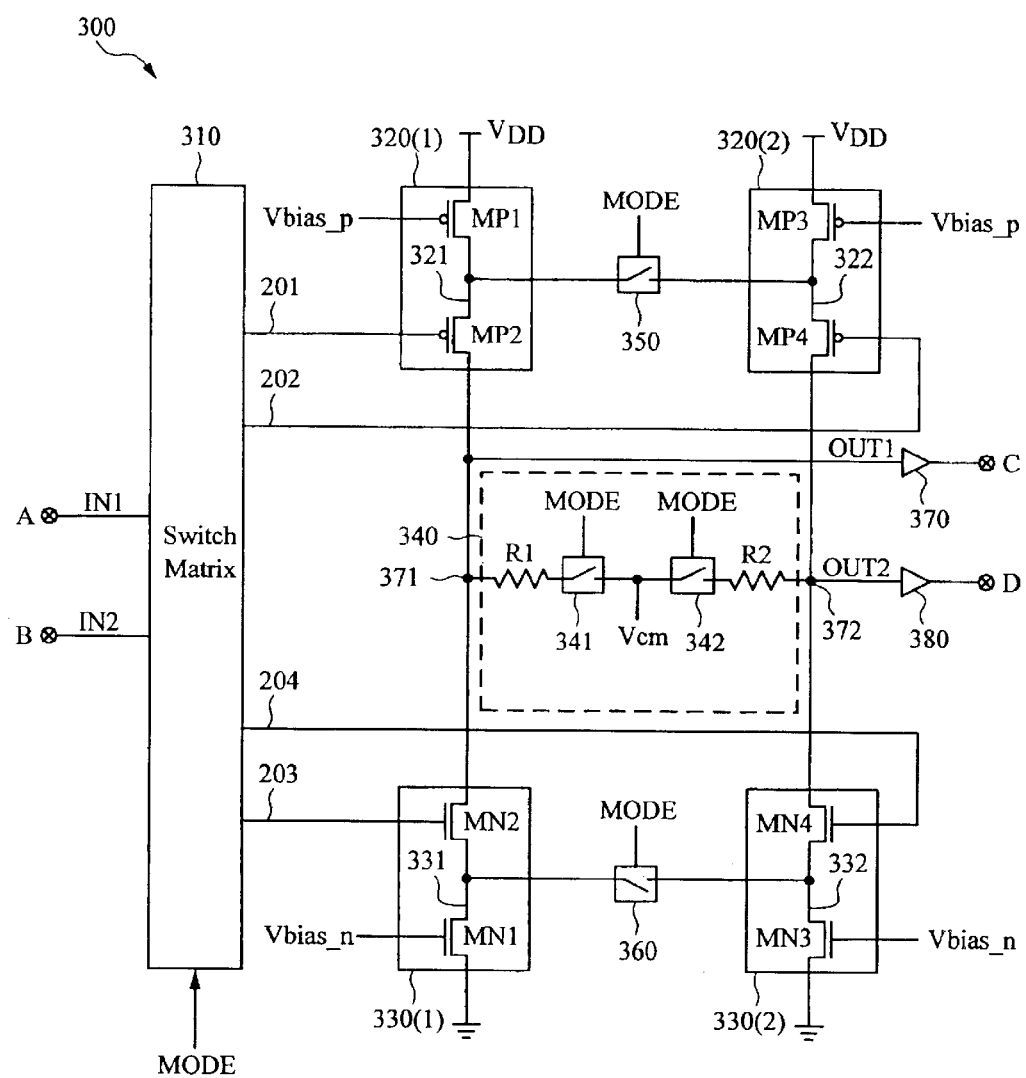
FIG. 3 is a simplified block diagram of a multi-function driver in accordance with the present invention.

FIG. 3 is a simplified block diagram of a multi-function I/O driver 300 configurable to process either single-ended or differential input signals. Driver 300 includes a switch matrix 310, two pull-up circuits 320(1) and 320(2), two pull-down circuits 330(1) and 330(2), a common mode voltage circuit 340, and switches 350 and 360. Switch matrix 310 includes inputs coupled to I/O pads A and B, outputs coupled to internal signal lines 201–204, and a control terminal to receive a mode signal MODE. Switch matrix 310, which is well-known, selectively routes input signals provided on I/O pads A and B to circuits 320(1), 320(2), 330(1) and 330(2) via signal lines 201–204, respectively. The signal MODE indicates whether input signals provided on I/O pads A and B are to be processed as single-ended signals or as differential signals. For one embodiment, a logic low MODE signal configures driver 300 to process signals as single-ended signals such as, for example, those specified by the HSTL I/O standard, and a logic high MODE signal configures driver 300 to process signals as differential signals such as, for example, those specified by the LVDS I/O standard.

Pull-up circuit 320(1) is modeled by PMOS transistors MP1 and MP2 connected in series between a supply voltage $V_{DD}$ and a first output node OUT1. The gate of MP1 is coupled to a first bias voltage Vbias_p, and the gate of MP2 is coupled to signal line 201. Pull-up circuit 320(2) is modeled by PMOS transistors MP3 and MP4 connected in series between $V_{DD}$ and a second output node OUT2. The gate of MP3 is coupled to Vbias_p, and the gate of MP4 is coupled to signal line 202. Pull-down circuit 330(1) is modeled by NMOS transistors MN1 and MN2 connected in series between OUT1 and ground potential. The gate of MN1 is coupled to a second bias voltage Vbias_n, and the gate of MN2 is coupled to signal line 203. Pull-down circuit 330(2) is modeled by NMOS transistors MN3 and MN4 connected in series between OUT2 and ground potential. The gate of MN3 is coupled to Vbias_n, and the gate of MN4 is coupled to signal line 204. For other embodiments, other circuit configurations can be used to implement the pull-up circuits 320 and the pull-down circuits 330.

Switch 350 has a first terminal connected to a node 321 between PMOS transistors MP1 and MP2 of pull-up circuit 320(1), a second terminal connected to a node 322 between PMOS transistors MP3 and MP4 of pull-up circuit 320(2), and a control terminal to receive MODE. Switch 360 has a first terminal connected to a node 331 between NMOS transistors MN1 and MN2 of pull-down circuit 330(1), a second terminal connected to a node 332 between NMOS transistors MN3 and MN4 of pull-down circuit 330(2), and a control terminal to receive MODE.

Common mode voltage circuit 340 includes a resistor R1, switches 341–342, and a resistor R2 connected in series between OUT1 and OUT2. For some embodiments, resistors R1 and R2 have a resistance of approximately 100 ohms, although other resistances can be used. Switches 341 and 342 selectively couple corresponding resistors R1 and R2 to a common mode voltage $V_{CM}$ in response to MODE. The common mode voltage, which for some embodiments is 1.2 volts as specified by the LVDS I/O standard, is provided by a well-known voltage supply (not shown for simplicity). For other embodiments, $V_{CM}$ may be a different value, for example, as specified by another differential I/O standard.

Switches 341, 342, 350, and 360 can be any suitable switch or switching circuit. For some embodiments, switches 341, 342, 350, and 360 are CMOS switches. For one embodiment, switches 341, 342, and 360 are NMOS transistors having gates responsive to MODE, and switch 350 is a PMOS transistor having a gate responsive to $\overline{\text{MODE}}$.

Output signals OUT1 and OUT2 are generated in response to input signals provided by switch matrix 310 on signal lines 201–204. Output node OUT1 is coupled to I/O pad C via a buffer 370, and output node OUT2 is coupled to I/O pad D via a buffer 380. Buffers 370 and 380 can be any well-known buffers. For other embodiments, buffers 370 and 380 can be eliminated.

In accordance with the present invention, driver 300 can be configured to process either single-ended signals or differential signals in response to the logic state of MODE. For some embodiments, MODE is a control signal provided by a user. For other embodiments, MODE can be generated by another circuit connected to driver 300. For simplicity, operation of driver 300 for processing single-ended signals is described below with respect to the HSTL I/O standard, and operation of driver 300 for processing differential signals is described below with respect to the LVDS I/O standard. However, embodiments of the present invention can be used to process other single-ended signals (e.g., as specified by GTL, SSTL, TTL, or other I/O standards) and/or to process other differential signals (e.g., as specified by LVPECL or other differential I/O standards).

To process single-ended (e.g., HSTL) signals, MODE is set to logic low, and two HSTL input signals are provided as IN1 and IN2 to input pads A and B, respectively. In response to the logic low state of MODE, switch matrix 310 routes IN1 from pad A to pull-up circuit 320(1) via line 201 and to pull-down circuit 330(1) via line 203, and routes IN2 from pad B to pull-up circuit 320(2) via line 202 and to pull-down circuit 330(2) via line 204. The logic low state of MODE opens switch 350 to decouple pull-up circuits 320(1) and 320(2) from each other, and opens switch 360 to de-couple pull-down circuits 330(1) and 330(2) from each other. The logic low state of MODE also opens switches 341–342, thereby de-coupling common mode voltage circuit 340 from driver 300. The first bias voltage Vbias_p is set to a minimum value, e.g., ground potential, to fully turn on transistors MP1 and MP3. The second bias voltage Vbias_n is set to a maximum value, e.g., $V_{DD}$, to fully turn on transistors MN1 and MN3. The resulting single-ended configuration for driver 300 is represented by an equivalent circuit 400 shown in FIG. 4.

Figure 4:
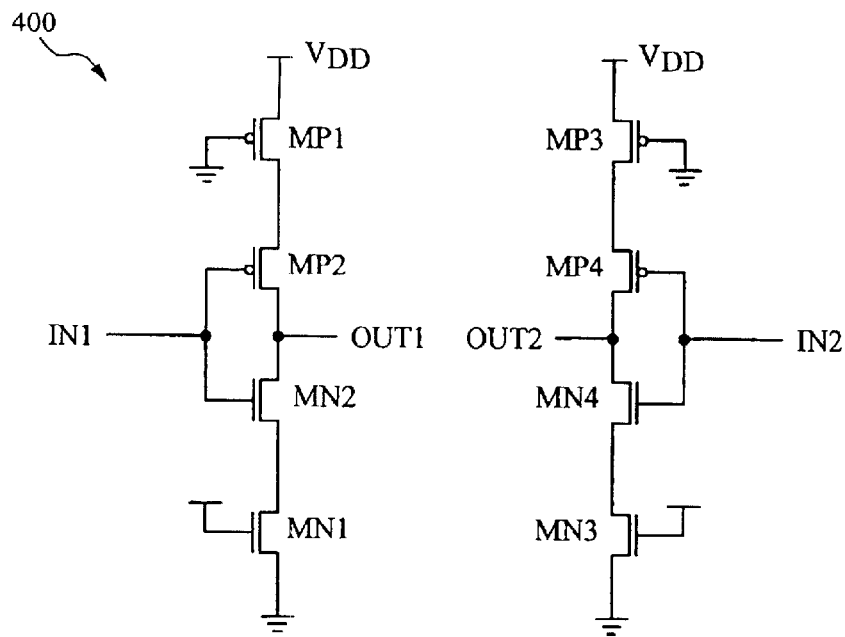
FIG. 4 is a simplified circuit diagram illustrating an exemplary single-ended configuration for the driver of FIG. 3.

Thus, referring to FIGS. 3 and 4, when MODE is logic low, pull-up circuit 320(1) and pull-down circuit 330(1) implement an inverting buffer to generate a first single-ended output signal OUT1 in response to the single-ended input signal IN1, and pull-up circuit 320(2) and pull-down circuit 330(2) implement an inverting buffer to generate a second single-ended output signal OUT2 in response to the single-ended input signal IN2. Specifically, transistors MP2 and MN2 form a CMOS inverter that logically inverts IN1 to generate OUT1, with transistors MP1 and MN1 providing suitable source resistances. Similarly, transistors MP4 and MN4 form a CMOS inverter that logically inverts IN2 to generate OUT2, with transistors MP3 and MN3 providing suitable source resistances. Thus, when MODE is logic low, driver 300 can simultaneously process 2 independent single-ended signals.

For some embodiments, transistors MP1, MP3, MN1, and MN3 are each sized to provide a 50 ohm source resistance as specified, for example, by the HSTL I/O standard. For other embodiments, transistors MP1, MP3, MN1, and MN3 can be sized to provide other source resistances, as may be specified by other I/O standards.

To process differential (e.g., LVDS) signals, MODE is set to logic high, and an input signal IN1 is provided to pad A. In response to the logic high state of MODE, switch matrix 310 complements IN1 to generate $\overline{\text{IN1}}$, thereby generating a differential signal between IN1 and $\overline{\text{IN1}}$. Switch matrix 310 can logically invert IN1 to generate $\overline{\text{IN1}}$ using any suitable inverting circuit such as, for example, a CMOS inverter. Switch matrix 310 routes IN1 from pad A to pull-up circuit 320(1) via line 201 and to pull-down circuit 330(1) via line 203, and routes $\overline{\text{IN1}}$ to pull-up circuit 320(2) via line 202 and to pull-down circuit 330(2) via line 204. The logic high state of MODE closes switch 350 to couple pull-up circuits 320(1) and 320(2) together, and closes switch 360 to couple pull-down circuits 330(1) and 330(2) together. The logic high state of MODE also closes switches 341–342 to couple common mode voltage circuit 340 between nodes OUT1 and OUT2. The first bias voltage Vbias_p is set to a first predetermined value that causes transistors MP1 and MP3 to provide a desired current flow. The second bias voltage Vbias_n is set to a second predetermined value that causes transistors MN1 and MN3 to provide the desired current flow. The resulting differential configuration for driver 300 is represented by an equivalent circuit 500 shown in FIG. 5.

Figure 5:
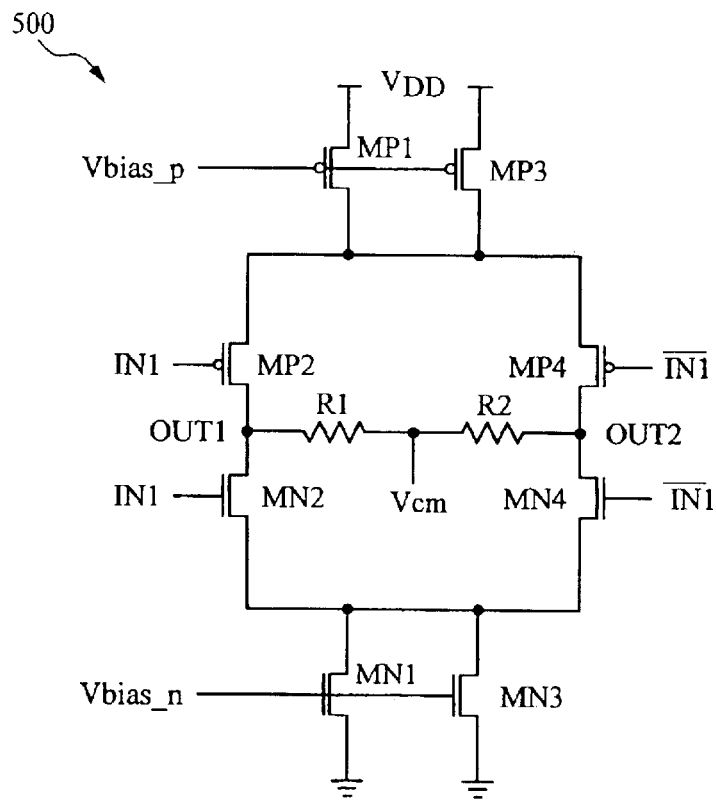
FIG. 5 is a simplified circuit diagram illustrating an exemplary differential configuration for the driver of FIG. 3.

Thus, referring to FIGS. 3 and 5, when MODE is logic high, pull-up circuits 320(1) and 320(2) implement a first differential circuit, and pull-down circuits 330(1) and 330(2) implement a second differential circuit. The first and second differential circuits operate to generate a differential output signal between OUT1 and OUT2 in response to the differential input signal between IN1 and $\overline{\text{IN1}}$. Specifically, transistors MN2 and MN4 form an NMOS differential pair, and transistors MP2 and MP4 form a PMOS differential pair. Transistors MN1 and MN3 implement a current source to bias the NMOS differential pair MN2/MN4, and transistors MP1 and MP3 implement a current source to bias the PMOS differential pair MP2/MP4. For some embodiments, Vbias_p is selected so that transistors MP1 and MP3 provide a bias current of 8 mA, and Vbias_n is selected so that transistors MN1 and MN3 provide a bias current of 8 mA (as specified, for example, by the LVDS I/O standard). For other embodiments, transistor pairs MP1/MP3 and MN1/MN3 can be configured to provide other bias currents, as may be required by other differential I/O standards.

In operation, IN1 is provided to the gates of transistors MP2 and MN2, $\overline{\text{IN1}}$ is provided to the gates of transistors MP4 and MN4, and $V_{CM}$ is maintained at 1.2 volts. When IN1 exceeds $\overline{\text{IN1}}$, current sourced by transistors MP1 and MP3 flows through transistor MP4, resistors R2 and R1, and transistor MN2 to create a differential signal between OUT2 and OUT1. Conversely, when $\overline{\text{IN1}}$ exceeds IN1, current sourced by transistors MP1 and MP3 flows through transistor MP2, resistors R1 and R2, and transistor MN4 to create a differential signal between OUT1 and OUT2. In this manner, driver 300 generates a differential output signal that is centered about $V_{CM}$.

Thus, as described above, driver 300 can receive a single-ended signal IN1, invert IN1 to generate $\overline{\text{IN1}}$, and then process the differential signal between IN1 and $\overline{\text{IN1}}$ to create a differential output signal between OUT1 and OUT2. For other embodiments, a differential input signal can be provided to switch matrix 310 as IN1 and $\overline{\text{IN1}}$ on pads A and B, and then processed as described above to generate a corresponding differential output signal between OUT1 and OUT2. For such embodiments, switch matrix 310 routes IN1 from pad A to pull-up circuit 320(1) and to pull-down circuit 330(1), and routes IN1 from pad B to pull-up circuit 320(2) and to pull-down circuit 330(2).

Figure 1:
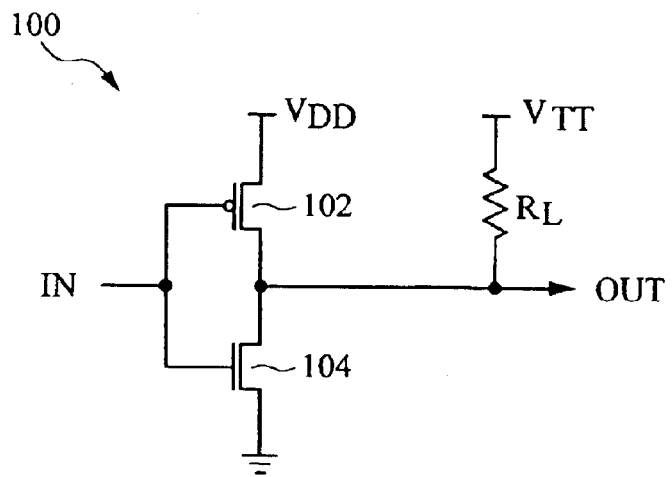
FIG. 1 is a circuit diagram of a well-known driver to process single-ended signals.
Figure 2:
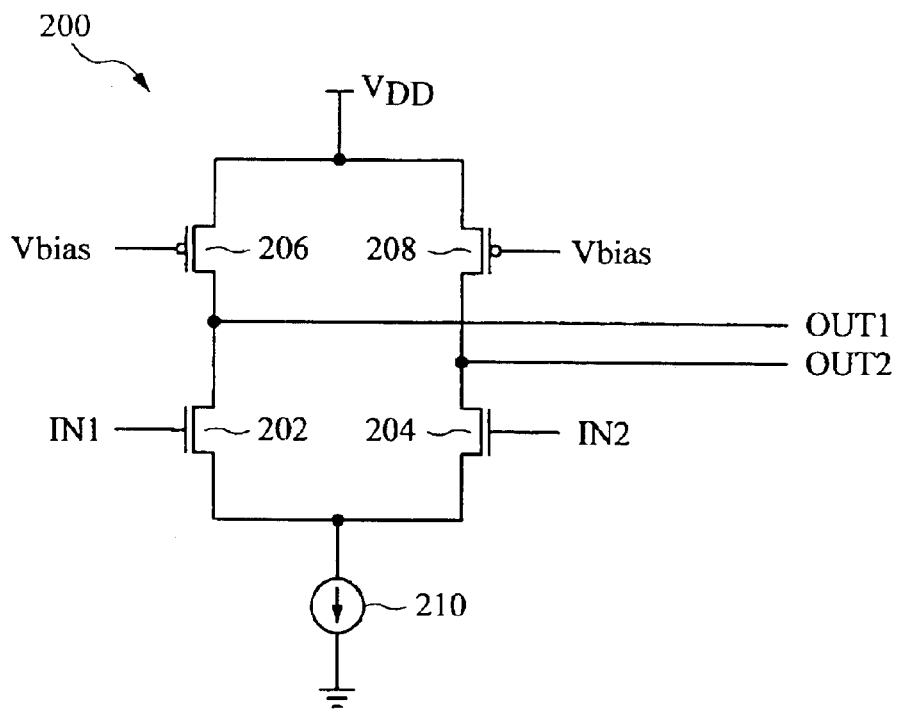
FIG. 2 is a circuit diagram of a well-known driver to process differential signals.

The ability of driver 300 to process either single-ended signals or differential signals using the same circuitry eliminates the need to have separate drivers to process single-ended and differential signals, thereby reducing circuit complexity and silicon area. Thus, for example, driver 300 can be configured to implement either of the I/O configurations shown in FIGS. 1 and 2, or any other driver or input circuit to process various single-ended or differential I/O standards developed in the future. In addition, the ability of driver 300 to process either single-ended signals or differential signals using the same circuitry makes driver 300 suitable for use in logic devices that utilize various signaling standards. For example, driver 300 is ideal for use in FPGA devices that use HSTL I/O standards for memory access and LVDS I/O standards for backplane communications.

Further, because driver 300 can be used to process either single-ended and differential signals, driver 300 can be sold to customers for use in either single-ended or differential signaling applications, thereby allowing the same configurable driver 300 to compete in various markets once served by a multitude of different I/O drivers. As a result, development, processing, and marketing costs associated with providing separate drivers to satisfy different I/O standards can be minimized.

Figure 6:
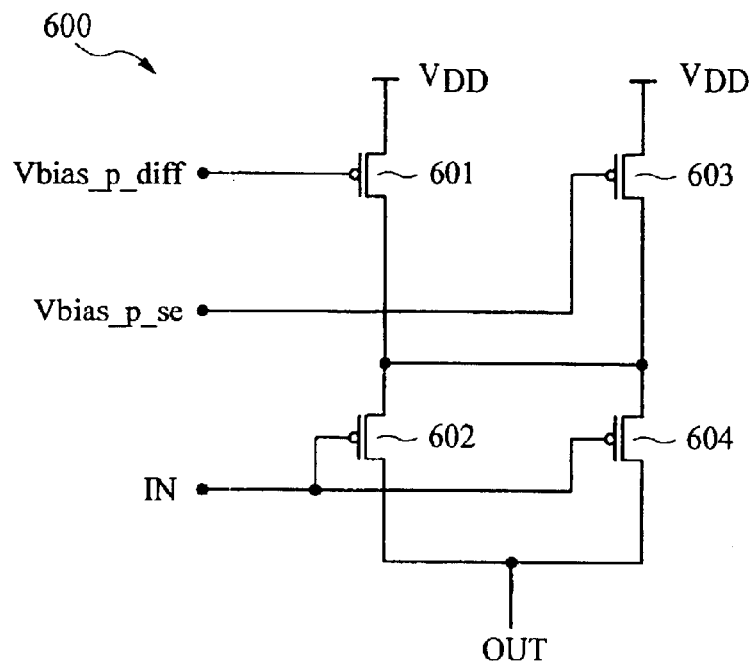
FIG. 6 is a circuit diagram of one embodiment of the pull-up circuit of FIG. 3.

FIG. 6 shows a pull-up circuit 600 that is one embodiment of pull-up circuits 320 of FIG. 3. Circuit 600 includes two PMOS transistor pairs 601–602 and 603–604 each connected in series between $V_{DD}$ and the output node OUT. The gates of transistors 602 and 604 receive the input signal IN, and the sources of transistors 602 and 604 are coupled together. The gate of transistor 601 receives a bias voltage Vbias_p_diff, and the gate of transistor 603 receives a bias voltage Vbias_p_se. For some embodiments, transistors 601 and 603 can be modeled as transistor MP1 of pull-up circuit 320(1) and as transistor MP3 of pull-up circuit 320(2), and transistors 602 and 604 can be modeled as transistor MP2 of pull-up circuit 320(1) and as transistor MP4 of pull-up circuit 320(2). The bias voltages Vbias_p_diff and Vbias_p se are generated by a suitable bias circuit (not shown in FIG. 6).

When MODE is logic low, which indicates driver 300 is in the single-ended signal processing mode, Vbias_p_diff is set to a maximum voltage (e.g., $V_{DD}$) to turn off transistor 601, and Vbias_p_se is set to a minimum voltage (e.g., ground potential) to turn on transistor 603. Thus, during the single-ended mode, transistor 603 provides all the current for transistor pair 602/604. For some embodiments, transistor 603 is sized and doped to provide a 50 ohm load resistance between $V_{DD}$ and transistor pair 602/604 when Vbias_p_se is set to the minimum voltage.

When MODE is logic high, which indicates driver 300 is in the differential signal processing mode, the gates of transistors 601 and 603 are coupled together and to a predetermined bias voltage Vbias_p_lvds (i.e., Vbias_p_diff=Vbias_p_se=Vbias_p_lvds). Thus, transistors 601 and 603 together act as a current source for transistors 602 and 604. Vbias_p_lvds is set to a level that causes transistors 601 and 603 to provide a desired bias current for the differential operation mode. For one embodiment, transistors 601 and 603 provide 8 mA of current when MODE is logic high, as specified by the LVDS I/O standard.

For some embodiments, transistors 601 and 603 have much greater current-carrying capacities than transistors 602 and 604, respectively. For some embodiments in which pull-up circuit 600 is fabricated using a 0.2 micron processing technology, transistor 601 has an effective channel width of 30×, transistor 603 has an effective channel width of 6×, transistor 602 has an effective channel width of 14×, and transistor 604 has an effective channel width of 2×.

Figure 7:
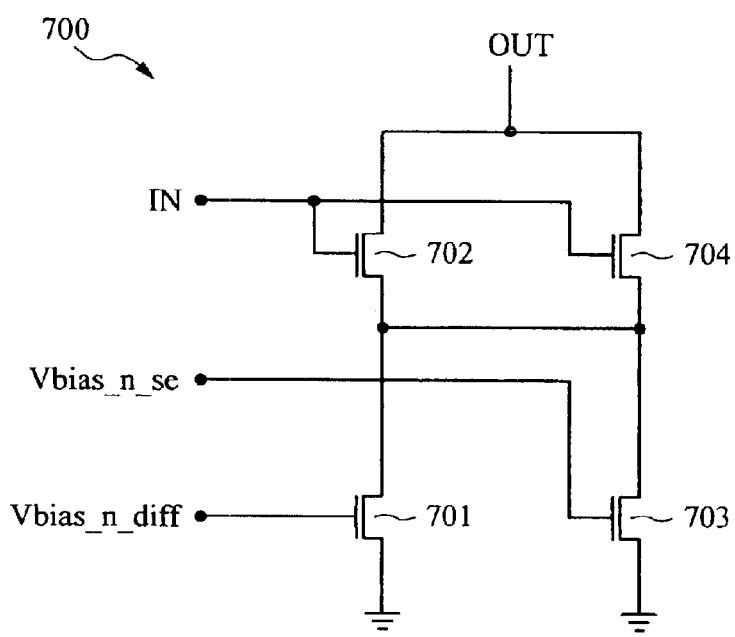
FIG. 7 is a circuit diagram of one embodiment of the pull-down circuit of FIG. 3.

FIG. 7 is a pull-down circuit 700 that is one embodiment of pull-down circuits 330 of FIG. 3. Circuit 700 includes two NMOS transistor pairs 701–702 and 703–704 each connected in series between OUT and ground potential. The gates of transistors 702 and 704 receive the input signal IN, and the drains of transistors 702 and 704 are coupled together. The gate of transistor 701 receives a bias voltage Vbias_n_diff, and the gate of transistor 703 receives a bias voltage Vbias_n_se. For some embodiments, transistors 701 and 703 can be modeled as transistor MN1 of pull-down circuit 330(1) and as transistor MN3 of pull-down circuit 330(2), and transistors 702 and 704 can be modeled as transistor MN2 of pull-down circuit 330(1) and as transistor MN4 of pull-down circuit 330(2). The bias voltages Vbias_n_diff and Vbias_n_se are generated by a suitable bias circuit (not shown in FIG. 7).

When MODE is logic low, which indicates driver 300 is in the single-ended signal processing mode, Vbias_n_diff is set to a minimum voltage (e.g., ground potential) to turn off transistor 701 and Vbias_n_se is set to a maximum voltage (e.g., $V_{DD}$) to turn on transistor 703. Thus, during the single-ended mode, transistor 703 provides all the current for transistor pair 702/704. Transistor 703 is sized and doped to provide a 50 ohm load resistance between transistor pair 702/704 and ground potential when Vbias_n se is set to the maximum voltage.

When MODE is logic high, which indicates driver 300 is in the differential signal processing mode, the gates of transistors 701 and 703 are coupled together and to a predetermined bias voltage Vbias_n_lvds (i.e., Vbias_n_diff=Vbias_n_se=Vbias_n-lvds). Thus, transistors 701 and 703 together act as a current source for transistors 702 and 704. Vbias_n_lvds is set to a level that causes transistors 701 and 703 to provide a desired bias current for the differential operation mode. For one embodiment, transistors 701 and 703 conduct 8 mA of current when MODE is logic high, as specified by the LVDS I/O standard.

For some embodiments, transistors 701 and 703 have much greater current-carrying capacities than transistors 702 and 704, respectively. For some embodiments in which pull-down circuit 700 is fabricated using a 0.2 micron processing technology, transistor 701 has an effective channel width of 30×, transistor 703 has an effective channel width of 6×, transistor 702 has an effective channel width of 14×, and transistor 704 has an effective channel width of 2×.

Figure 8:
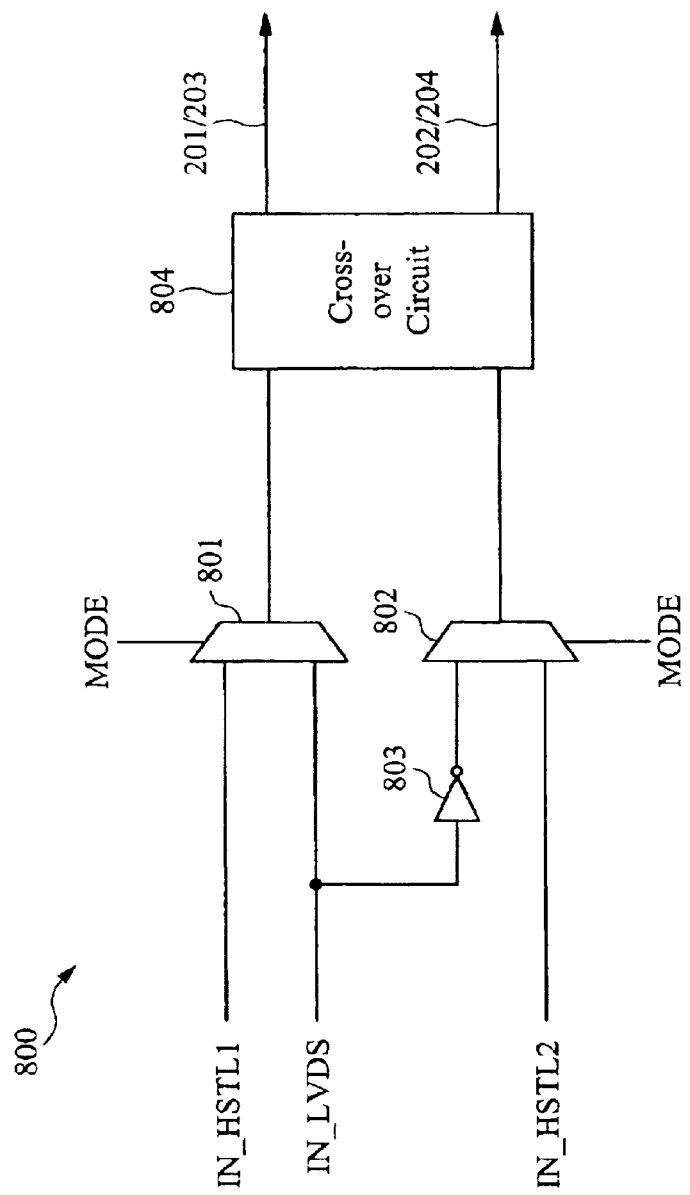
FIG. 8 is a simplified circuit diagram for one embodiment of the switch matrix of FIG. 3.

FIG. 8 is a switch matrix 800 that is one embodiment of switch matrix 310 of FIG. 3. Switch matrix 800 includes multiplexers (MUX) 801 and 802, an inverter 803, and a cross-over circuit 804. MUX 801 includes a first input to receive a first HSTL input signal IN_HSTL1, a second input to receive an LVDS input signal IN_LVDS, a control terminal to receive MODE, and an output coupled to cross-over circuit 804. MUX 802 includes a first input to receive a second HSTL input signal IN_HSTL2, a second input to receive a differential signal $\overline{IN\_LVDS}$ generated from IN_LVDS by inverter 803, a control terminal to receive MODE, and an output coupled to cross-over circuit 804.

Cross-over circuit 804 is well-known, and is configured to selectively route the input signals to signal lines 201–204 as described above with respect to FIG. 3. For example, when MODE is logic low, cross-over circuit 804 routes IN_HSTL1 to the inputs of pull-up circuit 320(1) and pull-down circuit 330(1), and routes IN_HSTL2 to the inputs of pull-up circuit 320(2) and pull-down circuit 330 (2). When MODE is logic high, cross-over circuit 804 routes IN_LVDS to the inputs of pull-up circuit 320(1) and pull-down circit 330(1), and routes $\overline{IN\_LVDS}$ to the inputs of pull-up circuit 320(2) and pull-down circuit 330(2).

Figure 9A:
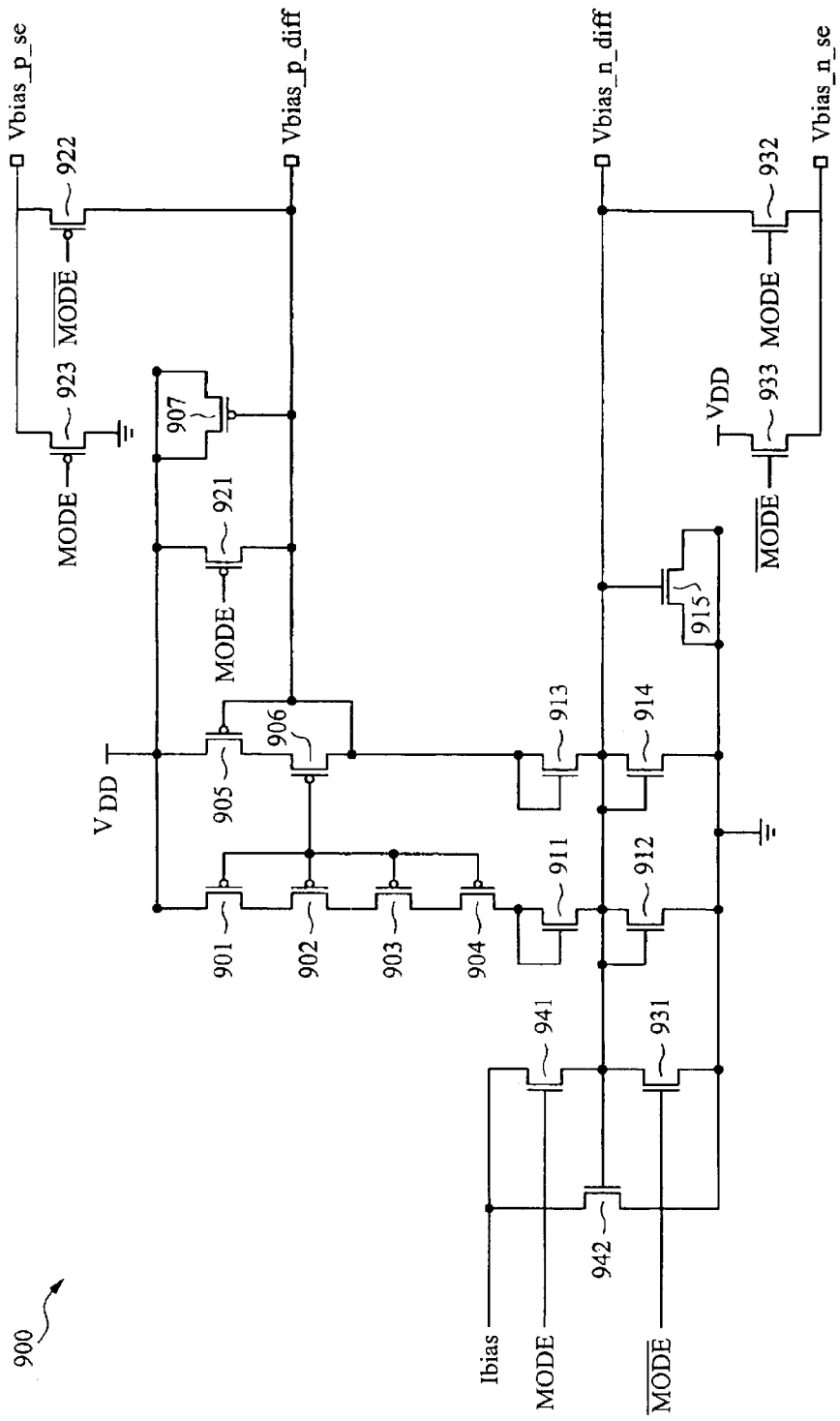
FIG. 9A is circuit diagram for one embodiment of a bias circuit for drivers of the present invention.

FIG. 9A shows a bias circuit 900 that can be used to generate the bias voltages Vbias_p_diff, Vbias_p_se, Vbias_n_diff, and Vbias_n_se utilized in the embodiments of FIGS. 6 and 7. Bias circuit 900 receives a bias current Ibias from a well-known current source and, in response to MODE, generates the bias voltages Vbias_p_diff, Vbias_p_se, Vbias_n_diff, and Vbias_n_se. Thus, for example, when MODE is logic low to indicate the single-ended processing mode, bias circuit 900 couples Vbias_p_diff and Vbias_n_se to maximum values and couples Vbias_p_se and Vbias_n_diff to minimum values. Specifically, when MODE=0 and $\overline{MODE}$=1, PMOS transistor 921 is conductive and couples Vbias_p_diff to $V_{DD}$, PMOS transistor 923 is conductive and couples Vbias_p_se to ground potential, NMOS transistor 931 is conductive and couples Vbias_n_diff to ground potential, and NMOS transistor 933 is conductive and couples Vbias_n_se to $V_{DD}$. The logic low state of MODE also turns off NMOS transistor 932 to isolate Vbias_n_diff from Vbias_n_se, and the logic high state of $\overline{MODE}$ turns off PMOS transistor 923 to isolate Vbias_p_diff from Vbias_p_se.

Conversely, when MODE is logic high to indicate the differential processing mode, bias circuit 900 couples Vbias_p_diff and Vbias_p_se to a first predetermined voltage (e.g., Vbias_p_lvds) and couples Vbias_n_diff and Vbias_n_se to a second predetermined voltage (e.g., Vbias_n_lvds). Specifically, when MODE=1 and $\overline{MODE}$=0, PMOS transistor 922 turns on and couples Vbias_p_diff and Vbias_p_se together, and NMOS transistor 932 turns on and couples Vbias_n_diff and Vbias_n_se together. The logic high state of MODE also turns off PMOS transistor 921 to isolate Vbias_p_diff from $V_{DD}$, and turns off PMOS transistor 923 to isolate Vbias_p_diff from ground potential. The logic low state of $\overline{MODE}$ turns off NMOS transistor 931 to isolate Vbias_n_diff from ground potential, and turns off NMOS transistor 933 to isolate Vbias_n_se from $V_{DD}$. PMOS transistors 901–907 and NMOS transistors 911–915 set up the first predetermined bias voltage Vbias_p_lvds for Vbias_p_diff and Vbias_p_se, and set up the second bias voltage Vbias_n_lvds for Vbias_n_diff and Vbias_n_se.

In response to the logic high state of MODE, NMOS transistor 941 turns on and NMOS transistor 931 turn off, and the bias current Ibias is mirrored through PMOS transistors 905–906 and NMOS transistors 913–914. Because the gates of PMOS transistors 601 and 603 of pull-up circuit 600 are coupled to the gates of PMOS transistors 905 and 906, transistors 601 and 603 mirror a current proportional to Ibias (see also FIG. 6). Similarly, because the gates of NMOS transistors 701 and 703 of pull-down circuit 700 are coupled to the gates of NMOS transistor 942, transistors 701 and 703 mirror a current proportional to Ibias (see also FIG. 7). As mentioned above, transistor pairs 601/603 and 701/703 are configured to conduct a current specified by a selected differential I/O standard (e.g., LVDS).

Figure 9B:
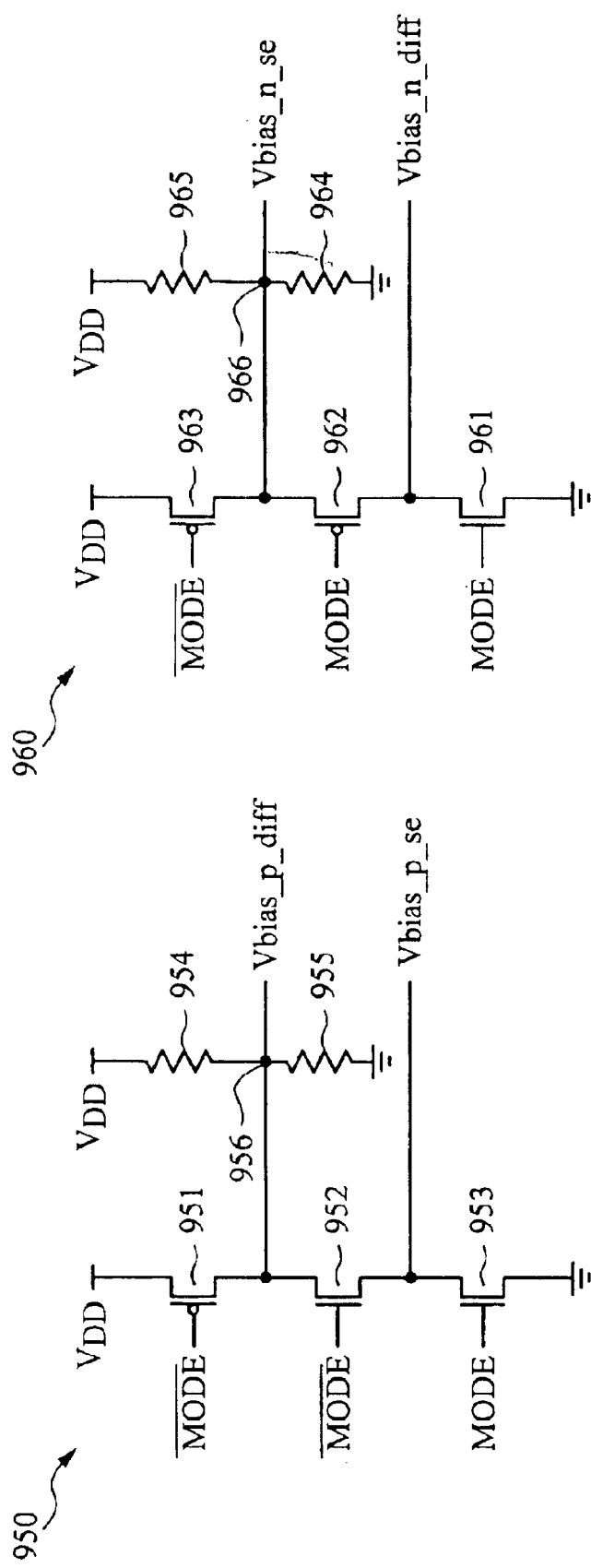
FIG. 9B is a simplified circuit diagram modeling the bias circuit of FIG. 9A.

Bias circuit 900 can be modeled by the bias circuits 950 and 960 shown in FIG. 9B. PMOS transistors 951, 952, and 953 of circuit 950 correspond to PMOS transistors 921, 922, and 923, respectively, of circuit 900, and NMOS transistors 961, 962, and 963 of circuit 960 correspond to NMOS transistors 931, 932, and 933, respectively, of circuit 900. Resistors 954 and 955 of circuit 950 are connected in series between $V_{DD}$ and ground potential, and implement a voltage divider to set up Vbias_p_lvds at node 956 when MODE is logic high. Similarly, resistors 964 and 965 of circuit 960 are connected in series between $V_{DD}$ and ground potential, and implement a voltage divider to set up Vbias_n_lvds at node 966 when MODE is logic high.

Figure 10:
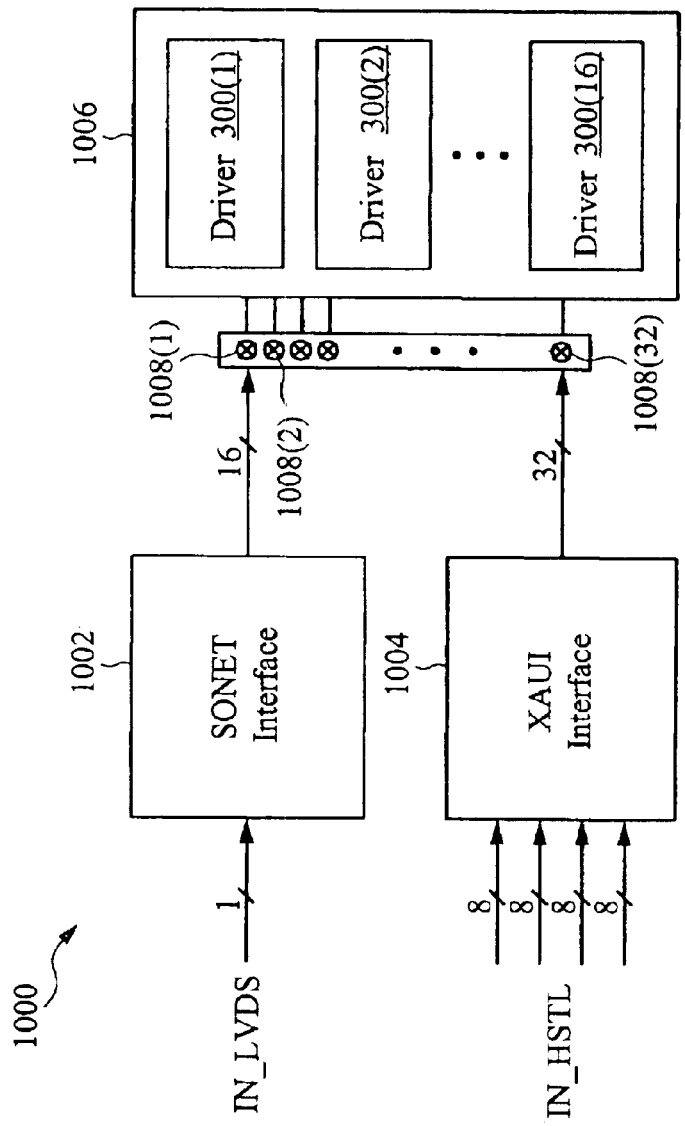
FIG. 10 is a block diagram of an interface system employing 16 drivers of FIG. 3.

FIG. 10 shows an interface circuit 1000 including an arrangement 1006 of 16 drivers 300(1)–300(16) connected in parallel. Each driver 300(1)–300(16) is connected to a corresponding pair of I/O pads 1008(1)–1008(32). The I/O pads 1008(1)–1008(32) are also coupled to outputs of a Synchronous Optical Network (SONET) interface 1002 and to outputs of a 10 Gigabit Attachment Unit Interface (XAUI) 1004.

SONET interface 1002 receives de-serializes a LVDS serial input signal IN_LVDS into 16 signal channels, and then routes each channel to a corresponding driver 300(1)–300(16) via pads 1008. Referring also to FIG. 3, the switch matrix 310 in each driver 300(1)–300(16) creates a differential input signal from IN_LVDS as described above, e.g., by complementing IN_LVDS to generate $\overline{IN\_LVDS}$. Thereafter, each driver 300(1)–300(16) processes its differential SONET input signal to generate a corresponding SONET differential output signal in the manner described above.

XAUI interface 1004 receives 4 pairs of HSTL-compliant single-ended input signals, each of which is 8 bits wide, and routes the resulting 32 input signals to corresponding pads 1008(1)–1008(32). Each driver 300(1)–300(16) receives a pair of these HSTL input signals, and processes them to generate a corresponding pair of HSTL single-ended output signals in the manner described above.

For other embodiments, arrangement 1006 can include any number of drivers 300, and I/O pads 1008 can be coupled to other interfaces configured to process single-ended and/or differential signals specified by other I/O standards.

Figure 11:
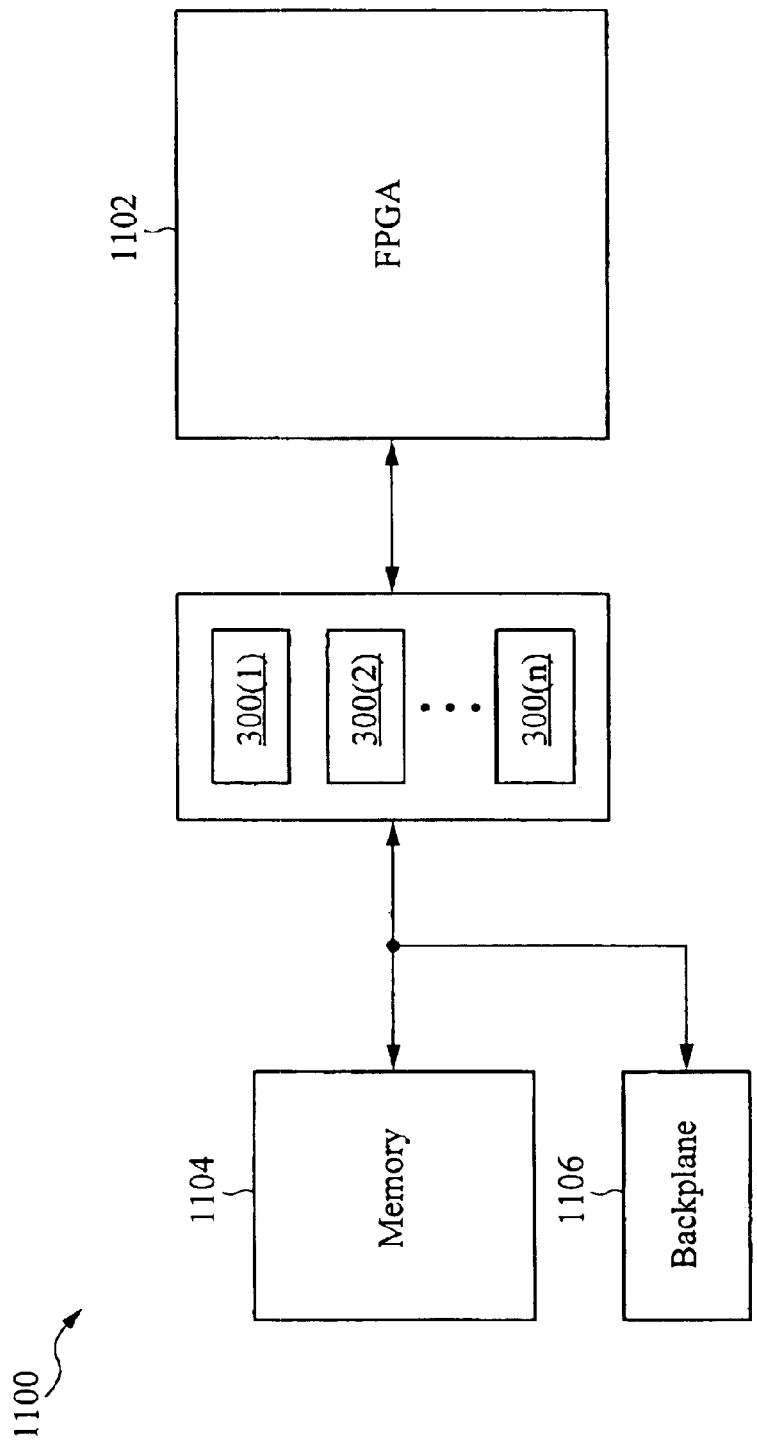
FIG. 11 is a block diagram illustrating an FPGA system employing any number of the drivers of FIG. 3.

As mentioned above, the ability of present embodiment to process both single-ended and differential signals using the same circuitry makes driver 300 ideal for use in various logic devices. For example, FIG. 11 shows a system 1100 having a plurality of drivers 300(1)–300(n) having first terminals coupled to an FPGA 1102 and having second terminals coupled to a memory system 1104 and to a backplane 1106. For some embodiments of FIG. 11, drivers 300(1)–300(n) provide HSTL signal buffering between FPGA 1102 and memory system 1104 in the manner described above, and provide LVDS signal buffering between FPGA 1102 and backplane 1106 in the manner described above.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A multi-function driver configurable to process either single-ended or differential signals, comprising:
a first pull-up circuit coupled between a supply voltage and a first output terminal, and including a first terminal to receive a first input signal, a second terminal to receive a first bias voltage, and a third terminal;
a second pull-up circuit coupled between the supply voltage and a second output terminal, and including a first terminal to receive a second input signal, a second terminal to receive the first bias voltage, and a third terminal;
a first pull-down circuit coupled between the first output terminal and ground potential, and including a first terminal to receive the first input signal, a second terminal to receive a second bias voltage, and a third terminal;
a second pull-down circuit coupled between the second output terminal and ground potential, and including a first terminal to receive the second input signal, a second terminal to receive the second bias voltage, and a third terminal;
a first switch connected between the third terminals of the first and second pull-up circuits, the first switch responsive to a mode signal; and
a second switch connected between the third terminals of the first and second pull-down circuits, the second switch responsive to the mode signal.

2. The driver of claim 1, wherein the mode signal determines whether the driver is configured to process single-ended signals or configured to process differential signals.

3. The driver of claim 1, wherein:
the first pull-up circuit and the first pull-down circuit are configured to implement a first inverter and the second pull-up circuit and the second pull-down circuit are configured to implement a second inverter when the mode signal is in a first logic state; and
the first and second pull-up circuits are configured to implement a first differential circuit and the first and second pull-down circuits are configured to implement a second differential circuit when the mode signal is in a second logic state.

4. The driver of claim 3, wherein:
setting the mode signal to the first logic state configures the driver as a high-speed transceiver logic (HSTL) driver; and
setting the mode signal to the second logic state configures the driver as a low-voltage differential signaling (LVDS) driver.

5. The driver of claim 1, further comprising:
a common mode voltage circuit selectively connected between the first and second output terminals in response to the mode signal.

6. The driver of claim 5, wherein the common mode voltage circuit is not coupled between the first and second output terminals when the mode signal is in a first logic state, and the common mode voltage circuit is coupled between the first and second output terminals when the mode signal is in a second logic state.

7. The driver of claim 5, wherein the common mode circuit comprises:
a first resistor and a third switch connected in series between the first output terminal and a common mode voltage node, the third switch responsive to the mode signal; and
a second resistor and a fourth switch connected in series between the second output terminal and the common mode voltage node, the second switch responsive to the mode signal.

8. The driver of claim 1, wherein the first and second pull-up circuits each comprise:
a first PMOS transistor connected in series between the supply voltage and the third terminal of the corresponding pull-up circuit, and having a gate responsive to the first bias voltage; and
a second PMOS transistor connected in series between the third terminal and the output terminal of the corresponding pull-up circuit, and having a gate responsive to the corresponding input signal.

9. The driver of claim 8, wherein the first and second pull-up circuits each further comprise:
a third PMOS transistor connected in parallel with the first PMOS transistor and having a gate to receive either the first bias voltage or a modified bias voltage in response to the mode signal.

10. The driver of claim 9, further including a bias circuit, comprising:
- a fourth PMOS transistor connected in series between the supply voltage and the gate of the first PMOS transistor, and having a gate responsive to the mode signal;
- a first NMOS transistor connected in series between the gates of the first and third PMOS transistors, and having a gate responsive to the mode signal;
- a second NMOS transistor connected in series between the gate of the third PMOS transistor and ground potential, and having a gate responsive to the mode signal;
- a first resistor connected between the supply voltage and the gate of the first PMOS transistor; and
- a second resistor connected between the gate of the first PMOS transistor and ground potential.

11. The driver of claim 1, wherein the first and second pull-down circuits each comprise:
- a first NMOS transistor connected in series between the third terminal of the corresponding pull-down circuit and ground potential, and having a gate responsive to the second bias voltage; and
- a second NMOS transistor connected in series between the output terminal and the third terminal of the corresponding pull-down circuit, and having a gate responsive to the corresponding input signal.

12. The driver of claim 11, wherein the first and second pull-down circuits each further comprise:
- a third NMOS transistor connected in parallel with the first NMOS transistor and having a gate to receive either the second bias voltage or a modified bias voltage in response to the mode signal.

13. The driver of claim 12, wherein the driver further includes a bias circuit, comprising:
- a fourth NMOS transistor connected in series between the gate of the first NMOS transistor and ground potential, and having a gate responsive to the mode signal;
- a first PMOS transistor connected in series between the gates of the first and third NMOS transistors, and having a gate responsive to the mode signal;
- a second PMOS transistor connected in series between the gate of the third PMOS transistor and the supply voltage, and having a gate responsive to the mode signal;
- a first resistor connected between the supply voltage and the gate of the first NMOS transistor; and
- a second resistor connected between the gate of the first NMOS transistor and ground potential.

14. A multi-function driver configurable to process either single-ended or differential signals, comprising:
- first and second circuits connected in series between a supply voltage and ground potential, the first and second circuits each having an input to receive a first input signal and having a first common output to provide a first output signal;
- third and fourth circuits connected in series between the supply voltage and ground potential, the third and fourth circuits each having an input to receive a second input signal and having a second common output to provide a second output signal;
- a first switch to selectively connect the first and third circuits together in response to a mode signal; and
- a second switch to selectively connect the second and fourth circuits together in response to the mode signal, wherein the mode signal indicates whether the driver is configured to process single-ended signals or differential signals.

15. The driver of claim 14, wherein:
- the first and second circuits implement a first inverter and the third and fourth circuits implement a second inverter to simultaneously process two single-ended signals when the mode signal is in a first logic state; and
- the first and third circuits implement a first differential circuit and the second and fourth circuits implement a second differential circuit to process a differential signal when the mode signal is in a second logic state.

16. The driver of claim 14, further comprising:
- a common mode voltage circuit selectively connected between the first and second common outputs in response to the mode signal.

17. The driver of claim 16, wherein the common mode voltage circuit is not coupled between the first and second common outputs when the mode signal is in a first logic state, and the common mode voltage circuit is coupled between the first and second common outputs when the mode signal is in a second logic state.

18. The driver of claim 14, wherein the first circuit comprises:
- a first PMOS transistor connected in series between the supply voltage and a first terminal of the first switch, and having a gate coupled to a first bias node;
- a second PMOS transistor connected in series between the first terminal of the first switch and the first common output, and having a gate responsive to the first input signal; and
- a third PMOS transistor connected in parallel with the first PMOS transistor, and having a gate coupled to a second bias node.

19. The driver of claim 10, wherein the third circuit comprises:
- a fourth PMOS transistor connected in series between the supply voltage and a second terminal of the first switch, and having a gate coupled to the first bias node;
- a fifth PMOS transistor connected in series between the second terminal of the first switch and the second common output, and having a gate responsive to the second input signal; and
- a sixth PMOS transistor connected in parallel with the fourth PMOS transistor, and having a gate coupled to the second bias node.

20. The driver of claim 19, further comprising:
- a bias circuit having first outputs coupled to the first and second bias nodes, the bias circuit providing the same bias voltage to the first and second bias nodes when the mode signal is in a first logic state and providing different bias voltages to the first and second bias nodes when the mode signal is in a second logic state.

21. The driver of claim 20, wherein the second circuit comprises:
- a first NMOS transistor connected in series between a first terminal of the second switch and ground potential, and having a gate coupled to a third bias node;
- a second NMOS transistor connected in series between the first common output and the first terminal of the second switch, and having a gate responsive to the first input signal; and
- a third NMOS transistor connected in parallel with the first NMOS transistor, and having a gate coupled to a fourth bias node.

22. The driver of claim 21, wherein the fourth circuit comprises:
- a fourth NMOS transistor connected in series between a second terminal of the second switch and ground potential, and having a gate coupled to the third bias node; and
- a fifth NMOS transistor connected in series between the second common output and the second terminal of the second switch, and having a gate responsive to the second input signal; and
- a sixth NMOS transistor connected in parallel with the fourth NMOS transistor, and having a gate coupled to the fourth bias node.

23. The driver of claim 22, wherein the bias circuit has second outputs coupled to the third and fourth bias nodes, the bias circuit providing the same bias voltage to the third and fourth bias nodes when the mode signal is in a first logic state and providing different bias voltages to the third and fourth bias nodes when the mode signal is in a second logic state.

24. A driver for processing single-ended and differential signals, comprising:
- first and second circuits connected in series between a supply voltage and ground potential;
- third and fourth circuits connected in series between the supply voltage and ground potential;
- means for configuring the first and second circuits to implement a first inverter and configuring the third and fourth circuits to implement a second inverter to simultaneously process two single-ended signals during a first mode; and
- means for configuring the first and third circuits to implement a first differential circuit and configuring the second and fourth circuits to implement a second differential circuit to process a differential signal during a second mode.

25. The driver of claim 24, further comprising:
- means for isolating the first and third circuits from each other and for isolating the second and fourth circuits from each other during the first mode; and
- means for connecting the first and third circuits together and for connecting the second and fourth circuits together during the second mode.

26. The driver of claim 24, further comprising:
- means for biasing the first and third circuits with a first bias voltage and for biasing the second and fourth circuits with a second bias voltage during the first mode; and
- means for biasing the first and third circuits with a third bias voltage and for biasing the second and fourth circuits with a fourth bias voltage during the second mode.

27. A method of processing single-ended and differential signals using a multi-function driver having first, second, third, and fourth circuits, comprising:
- configuring the first and second circuits to implement a first inverter and configuring the third and fourth circuits to implement a second inverter to simultaneously process two single-ended signals when a mode signal is in a first logic state; and
- configuring the first and third circuits to implement a first differential circuit and configuring the second and fourth circuits to implement a second differential circuit to process a differential signal when the mode signal is in a second logic state.

28. The method of claim 27, further comprising:
- isolating the first and third circuits from each other and isolating the second and fourth circuits from each other when the mode signal is in the first logic state; and
- connecting the first and third circuits together and connecting the second and fourth circuits together when the mode signal is in the second logic state.

29. The method of claim 27, further comprising:
- biasing the first and third circuits with a first bias voltage and biasing the second and fourth circuits with a second bias voltage when the mode signal is in the first logic state; and
- biasing the first and third circuits with a third bias voltage and biasing the second and fourth circuits with a fourth bias voltage when the mode signal is in the second logic state.

30. A method of processing single-ended and differential signals, comprising:
- providing first and second circuits connected in series between a supply voltage and ground potential;
- providing third and fourth circuits connected in series between the supply voltage and ground potential;
- providing a first input signal to the first and second circuits;
- providing a second input signal to the third and fourth circuits;
- configuring the first and second circuits to implement a first inverter and configuring the third and fourth circuits to implement a second inverter to simultaneously process the first and second input signals as independent single-ended signals when a mode signal is in a first logic state; and
- configuring the first and third circuits to implement a first differential circuit and configuring the second and fourth circuits to implement a second differential circuit to process the first and second input signals as differential signal when the mode signal is in a second logic state.

* * * * *